(12) United States Patent
Bao et al.

(10) Patent No.: US 6,891,237 B1
(45) Date of Patent: May 10, 2005

(54) ORGANIC SEMICONDUCTOR DEVICE HAVING AN ACTIVE DIELECTRIC LAYER COMPRISING SILSESQUIOXANES

(75) Inventors: Zhenan Bao, North Plainfield, NJ (US); Valerie Jeanne Kuck, Upper Montclair, NJ (US); Mark Anthony Paczkowski, Andover, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/603,941

(22) Filed: Jun. 27, 2000

(51) Int. Cl.$^7$ .............................................. H01L 29/76
(52) U.S. Cl. ................... 257/410; 257/411; 528/43; 427/387
(58) Field of Search ................. 257/632, 642, 257/410, 411, 650; 528/10, 21, 43; 427/387; 502/162, 167; 438/778, 780, 781, 782, 790

(56) References Cited

U.S. PATENT DOCUMENTS

| | | | | |
|---|---|---|---|---|
| 4,278,804 A | * | 7/1981 | Ashby et al. ............... | 556/436 |
| 4,756,977 A | * | 7/1988 | Haluska et al. ............. | 428/704 |
| 5,016,982 A | * | 5/1991 | Fergason et al. ............. | 349/33 |
| 5,321,102 A | * | 6/1994 | Loy et al. .................... | 525/474 |
| 5,384,376 A | | 1/1995 | Tunney et al. | |
| 5,500,537 A | * | 3/1996 | Tsumura et al. .............. | 257/40 |
| 5,665,845 A | * | 9/1997 | Allman .......................... | 528/8 |
| 5,693,566 A | | 12/1997 | Cheung | |
| 5,773,197 A | | 6/1998 | Carter et al. | |

(Continued)

FOREIGN PATENT DOCUMENTS

| | | | | |
|---|---|---|---|---|
| JP | 4-4-228415 | * | 8/1992 | ........... C01B/33/12 |

OTHER PUBLICATIONS

Allman et al., The Material Characteristics of a New Methyl–Phenyl Silsesquioxane Spin–On Glass for Use in a Global Non–Etchback Interconnect Planarization Process, Jun. 1991, IEEE, VMIC Conference, pp. 373–375.*

Jeng et al., Highly Porous Interlayer Dielectric For Interconnect Capacitance Reduction, 1995, Symposium on VLSI Technology Digest of Technical Papers, pp. 61–62.*

J.L. Hedrick et al., "Toughened, Inorganic–Organic Hybrid Materials For Microelectric Application", Mat. Res. Soc. Symp. Proc., vol. 443, Material Research Society, 1997, pp. 47–58.

Chou et al., "Integration of Low k Organic Flowable SOG in a Non–Etchback/CMP Process", SPIE, vol. 3214, 1997, pp. 86–93.

(Continued)

*Primary Examiner*—George Eckert

(57) ABSTRACT

An organic field effect transistor (FET) is described with an active dielectric layer comprising a low-temperature cured dielectric film of a liquid-deposited silsesquioxane precursor. The dielectric film comprises a silsesquioxane having a dielectric constant of greater than 2. The silsesquioxane dielectric film is advantageously prepared by curing oligomers having alkyl(methyl) and/or alkyl(methyl) pendant groups. The invention also embraces a process for making an organic FET comprising providing a substrate suitable for an organic FET; applying a liquid-phase solution of silsesquioxane precursors over the surface of the substrate; and curing the solution to form a silsesquioxane active dielectric layer. The organic FET thus produced has a high-dielectric, silsesquioxane film with a dielectric constant of greater than about 2, and advantageously, the substrate comprises an indium-tin oxide coated plastic substrate.

13 Claims, 2 Drawing Sheets

U.S. PATENT DOCUMENTS

| | | | |
|---|---|---|---|
| 5,895,263 A | | 4/1999 | Carter et al. |
| 5,953,627 A | * | 9/1999 | Carter et al. ................. 438/623 |
| 5,962,067 A | * | 10/1999 | Bautista et al. ........... 427/163.2 |
| 5,976,966 A | * | 11/1999 | Inoue .......................... 438/618 |
| 6,054,769 A | * | 4/2000 | Jeng ........................... 257/758 |
| 6,136,729 A | * | 10/2000 | Hopper et al. .............. 438/778 |
| 6,153,833 A | * | 11/2000 | Dawson et al. ............. 174/255 |
| 6,177,360 B1 | * | 1/2001 | Carter et al. ................ 438/781 |
| 6,197,663 B1 | * | 3/2001 | Chandross et al. ......... 438/455 |
| 6,214,748 B1 | * | 4/2001 | Kobayashi et al. .......... 438/782 |
| 6,251,486 B1 | * | 6/2001 | Chandross et al. ......... 427/387 |
| 6,322,860 B1 | * | 11/2001 | Stein et al. ................ 428/1.26 |
| 6,335,539 B1 | * | 1/2002 | Dimitrakopoulos et al. .. 257/40 |
| 6,602,804 B2 | * | 8/2003 | Allen et al. .................. 438/780 |
| 6,611,040 B2 | * | 8/2003 | Gelsomini et al. .......... 257/530 |
| 2002/0136910 A1 | * | 9/2002 | Hacker ....................... 428/450 |
| 2003/0134136 A1 | * | 7/2003 | Biscotto et al. ............. 428/472 |

OTHER PUBLICATIONS

Cook, Robert F. and Liniger, Eric G., "Stress–Corrosion Cracking of Low Dielectric–Constant Spin–On Glass Thin Films", *Electrochemical Society Proceedings*, vol. 98–3, pp. 129–148.

Remenar, Julius, F., et al., "Templating Nanopores Into Poly(Methylsilsequioxane): New Low–Dielectric Coatings Suitable for Microelectronic Applications", *Mat. Res. Soc. Symp. Proc.*, vol. 511, 1998, pp. 69–74.

A. Courtot–Descharles et al., "Density Functional Theory Applied to the Calculation of Dielectric Constant of Low–k Materials", *Microelectronics Reliability* 39, 1999, pp. 279–284.

Cook, et al., "Properties Development During Curing Of Low Dielectric–Constant Spin–On Glasses", *Mat. Res. Soc. Symp. Proc.*, vol. 511, 1998, pp. 33–38.

* cited by examiner

ORGANIC SEMICONDUCTOR DEVICE HAVING AN ACTIVE DIELECTRIC LAYER COMPRISING SILSESQUIOXANES

FIELD OF THE INVENTION

The present invention relates to an organic semiconductor device having an active dielectric layer fabricated with a liquid-deposited, high dielectric strength silsesquioxane.

BACKGROUND OF THE INVENTION

The metal-oxide semiconductor field-effect transistor (MOSFET or MOS device) is a dominant and important device in fabricating memory devices and integrated circuits, and various types of MOSFETS are known. MOSFET technology includes NMOS, PMOS, and CMOS technology. NMOS and PMOS devices are n-channel and p-channel devices, respectively, and CMOS devices comprise n-channel and p-channel devices integrated on the same chip. Other acronyms used to identify MOSFETs include DMOS (wherein "D" stands for "diffusion" or "double diffusion"), IGBT (Insulated Gate Bipolar Transistor), BiCMOS (CMOS having bipolar devices), and DGDMOS (Dual Gate DMOS).

There is a continuing desire in the microelectronics industry to miniaturize device components, increase the circuit density in integrated devices, and lower the cost of making the devices to increase their availability to consumers (e.g. large emissive displays, electronic paper, smart cards, and so forth). One field of research has explored the configuration and materials used in traditional, inorganic semiconductors. In this area, for example, new materials have been developed for use in making active dielectric layers, i.e., high-dielectric strength materials to be used in place of thin films of a-$SiO_x$. As the cell size has shrunk, designers have resorted to extremely thin or non-planar films of a-$SiO_x$, but these films have been problematic as they exhibit a decreased reliability due to finite breakdown fields or have other attendant problems such as step coverage and conformality. Thus, recently attention has focused on thicker films of $Ta_2O_5$, $TiO_2$, barium strontium titanate (BST) composites including $(Ba,Sr)TiO_3$, and other materials including use of doped titanium and tantalum oxides. See, e.g., U.S. Pat. No. 5,912,797, titled "Dielectric Materials of Amorphous Compositions and Devices Employing Same," issued Jun. 15, 1999 to inventors Schneemeyer and VanDover, and assigned to Lucent Technologies, Inc., the assignee herein, which is incorporated herein by reference.

Another area of research involves the development of new materials for use is in the insulating layers of inorganic semiconductors (e.g., as an insulator in a multilayer interconnection or an insulating layer between the semiconductor chip and substrate containing active components). In this quest, an opposite result is desired of obtaining low-dielectric constant materials. As may be appreciated, research relating to (I) the development of high-dielectric strength materials for use in active components, and (it) the development of low-dielectric materials for use in interconnect insulating layers, reflect distinct fields as the various processing and performance constraints differ in each case. Insulating properties relate to the ability of materials to block the passage of electrical charges, whereas dielectric properties relate to the ability of materials to store electrical charges. The current passage and current storage processes within a material are microscopically completely different. See, e.g., C. Kittel, INTRODUCTION TO SOLID STATE PHYSICS (John Wiley & Sons, NY). An increase in a material's insulating properties through chemical substitution may, in fact, decrease the dielectric properties.

In developing insulating materials for inorganic semiconductors, recently much attention has focused on forming highly porous organic polysilica materials comprising hybrid silsesquioxanes. See, e.g., U.S. Pat. No. 5,773,197 issued Jun. 30, 1998, "Integrated Circuit Device and Process for Its Manufacture," and U.S. Pat. No. 5,895,263, issued Apr. 20, 1999, "Process for Manufacture of Integrated Circuit Device," both of which are assigned to IBM Technologies Inc. and are incorporated herein by reference. These low-dielectric constant materials are used for fabricating intermediate layers between circuit layers, and they typically comprise reaction products of polysilicas and highly-branched or high molecular weight oligomers. High porosity is sought in making these materials to reduce the dielectric constant, advantageously to values of less than 3, more advantageously to values of less than 2.7 or 2.2.

The high porosity—and thus low dielectric constant—of these materials is achieved through various processing steps involving decomposition of the polymers to leave voids in the materials. To illustrate, the polymers are mixed in a solution with the polysilica; end groups of the polymers are reacted with the polysilica; the polymers are decomposed (e.g., by exposure to radiation or high temperatures, i.e. 350 to 400° C.); and then the polymers are allowed to diffuse out of the matrix, leaving voids in the polysilica material, generally the size of the domains of the decomposable polymer which can be controlled by molecular weight. (See, e.g., '263 patent, cited above, at cols. 34.) The resultant films typically have a desired thickness in the range of 0.2 to 1 $\mu$m, and in some instances less than 0.2 $\mu$m, making control of pore size, crack-resistance, and mechanical stability (e.g., modulus, hardness, toughness, etc.) significant considerations. See, e.g., Hawker et al., "Dendri-Glass—Design of Ultra-Low Dielectric Constant Materials Using Specialty Highly-branched Polymers," Abstracts of Papers of ACS, Vol. 215 (1988), at p. 301; Cook et al., "Stress-Corrosion Cracking of Low Dielectric-Constant Spin-On Glass Thin Films," Electrochemical Society Proceedings, Vol. 98-3, pp. 129–148; and Cook et al., "Properties Development During Curing of Low Dielectric-Constant Spin-On Glasses," Mat. Res. Soc. Symp. Proc. Vol. 511 (1998), Materials Research Society, pp. 33–38, all three of which are incorporated herein by reference. Thus, the use of silsesquioxanes as low dielectric constant materials for insulating layers of inorganic semiconductor devices presents drawbacks in terms of the processing steps required to achieve suitable materials and conflicting optimization parameters.

Besides developing new materials for inorganic semiconductors, the drive toward hybridization and low-cost electronics has precipitated another area of research relating to the development of organic field-effect transistors (FETs). Organic materials are attractive for use in electronic devices as they are compatible with plastics and can be easily fabricated to provide low-cost, lightweight, and flexible devices with plastic substrates. However, organic devices provide their own materials constraints, e.g., concerns in developing active materials include their compatibility with and adhesiveness to plastic substrates and stability during processing steps. To illustrate, a dielectric film for an organic device should be formable at lower temperatures than those used in fabricating typical, inorganic devices, so that the films are compatible with a large number of plastics.

Presently-available organic polymers do not meet all the criteria needed for high-performance, low cost organic FETs. For example, polyimides are commonly used as dielectrics in organic devices. However, most polyimides require high curing temperatures above 200° C., rendering them unsuitable for use with many plastic substrates. Pre-converted soluble polyimides may be used to achieve a lower curing temperature but these usually have limited solubilities in fabricating thicker films (~greater than 1 μm in thickness) which are necessary for the high voltages at which organic FETs operate (voltages of ~>50 Volts).

Another organic material used as a dielectric in organic devices and suitable for spin-casting is benzocyclobutene (BCB), but this requires high conversion temperatures and strict exclusion of oxygen during curing. Also, when BCB is used as a dielectric, the p-channel devices tend to have high-off currents whereas n-channel devices tend to have low field-effect mobilities (e.g., as compared with devices fabricated with $SiO_2$ as dielectrics). All-polymer logic circuits have been made incorporating poly(vinylphenol), but the current-voltage (I-V) characteristics of these devices tend to change dramatically with time. See, e.g., Z. Bao et al, "Printable Organic and Polymeric Semiconducting Materials and Devices," J. MATER. CHEM. Vol. 9, (1999), at p. 1895. Poly(methylmethacrylates) (PMMA) are other organic materials that have been used as dielectrics in organic devices but these tend to have low glass transition temperatures and are easily soluble in other organic solvents used during device processing which is disadvantageous.

Furthermore, microcontact printing has evolved as an advantageous patterning method for producing feature sizes as small as 1 μm. While $SiO_2$ as a dielectric is compatible with micro-contact printing, many of the polymers used for organic dielectrics are not, e.g., the polymers delaminate from their substrates when the micro-contact printing process is carried out.

As may be appreciated, those in the field of semiconducting devices continue to search for new materials and components to reduce the size, increase the efficiency, simplify the process, and reduce the cost of fabricating the devices. In particular, it would be advantageous in realizing high-performance field-effect transistors to provide solution processable dielectric materials compatible with organic semiconductors and with microcontact printing processes. These and further advantages may appear more fully upon considering the description given below.

SUMMARY OF THE INVENTION

Summarily described, the invention comprises an organic field effect transistor (FET) with an active dielectric layer disposed on a substrate, wherein the active dielectric layer comprises a low temperature cured product of a liquid-deposited silsesquioxane precursor. Referring to FIG. 3, in one embodiment, the invention is directed to an article comprising an organic FET comprising a gate electrode 1 on a substrate 2; an active dielectric layer 3 over the substrate 2; an active semiconducting layer 4 over the active dielectric layer, wherein the active dielectric layer comprises a low-temperature cured high-speed deposition product of at least silsesquioxane precursor; and a source electrode 5 and a drain electrode 6 in contact with the active semiconducting layer. The silsesquioxane precursor is cured to form a high-dielectric strength film of silsesquioxanes. The silsesquioxane precursors preferably comprise alkyl(methyl) and/or alkyl(methyl) phenyl oligomers. The invention also embraces a process for making an organic FET comprising providing a substrate suitable for an organic FET, applying a liquid-phase solution of silsesquioxane precursors over the surface of the substrate; and curing the solution to form a silsesquioxane active dielectric layer. The organic FET thus produced has a high-dielectric, silsesquioxane film with a dielectric constant of greater than about 2, and advantageously, the substrate comprises an indium-tin oxide coated plastic substrate.

BRIEF DESCRIPTION OF THE DRAWINGS

For a better understanding of the invention, an exemplary embodiment is described below, considered together with the accompanying drawings, in which.

Figure 1:
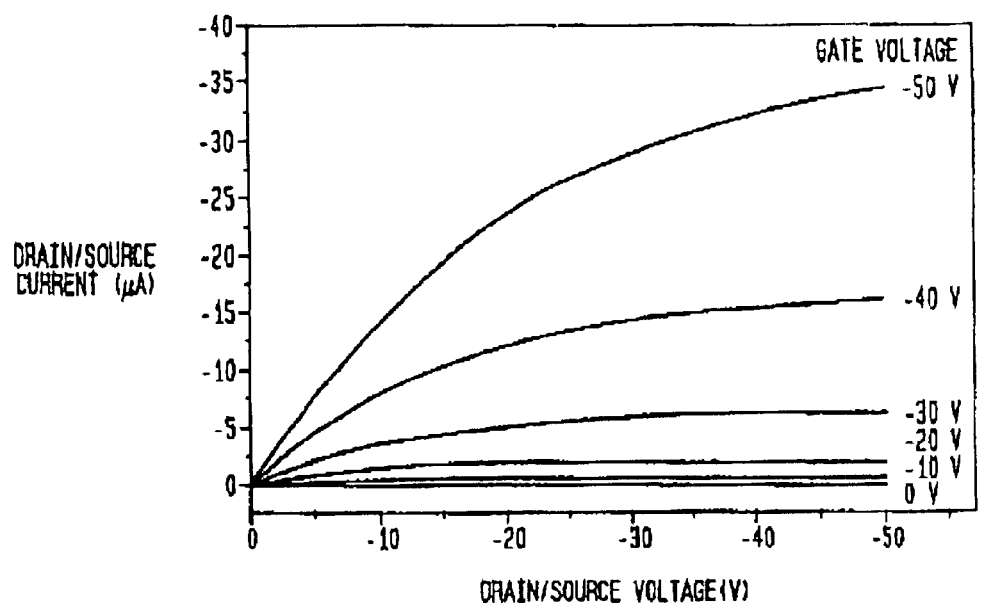
FIG. 1 is a graph plotting current voltage (I-V) values for an inventive FET device using pentacene as the semiconducting layer and bottom contact micro contact printed gold (Au) electrodes.

It is to be understood that these drawings are for the purposes of illustrating the concepts of the invention, are not limiting in nature, and except for the graphs are not to scale.

DETAILED DESCRIPTION OF THE INVENTION

Applicants have discovered a process of fabricating films of silsesquioxanes having high dielectric strengths suitable for use as active dielectric layers in organic FETs. These compounds meet the desired criteria for this application including the capability to generate dielectric films that 1) are thin and essentially pinhole-free with a high breakdown voltage and good long-term stability; 2) are formable at low temperatures (e.g., about less than 150° C.), to be compatible with a large number of plastics; 3) have good adhesion to plastic substrates; 4) are generally compatible with other materials used in making organic semiconductors (e.g., so as not to affect or degrade the performance of the semiconducting films disposed either above or below the dielectric); 5) may be applied by conventional methods, such as by spin-coating or off-set printing; 6) are compatible with subsequent processing steps in making the FET devices; 7) can be patterned using conventional photolithography; and 8) have low surface trapping densities, good surface smoothness, and low concentrations of ionic impurities.

Precursors of the inventive materials are soluble in common organic solvents (e.g., methanol, n-butanol, isopropanol), and can be applied by conventional liquid coating technologies to produce films having the desired thickness, depending on the application. Typically this thickness will be in the range of 1,000 to 40,000 Å, more preferably in the range 1,000 to 10,000 Å. The precursors can be cured, e.g., after solvent removal, at temperatures of less than 200° C., more preferably at temperatures of less than about 150° C., to produce films having high dielectric strength, low leakage current, and good hydrolytic and thermal stability. For example, the materials may be prepared with dielectric constants ($\epsilon$) in the range of about 2.0 to 4.0, and leakage current density of less than about $10^{-9}$ $A/cm^2$.

According to one aspect of the invention, a liquid-phase solution of one or more silsesquioxane precursors is deposited onto a substrate suitable for an organic FET, such as a plastic or glass substrate, and cured to form a dielectric film. The silsesquioxane precursors (oligomers) are characterized by the group ratio A:B:C, wherein each of A, B, and C reflect pendant groups. A pendant group is a moiety attached to a silicon atom having one or two carbon-based groups, e.g., the carbon-based groups comprise methyl, dimethyl, and phenyl groups. Where A reflects the percentage of silicon atoms having methyl pendant groups, B reflects the percentage of silicon atoms having dimethyl pendant groups, and C reflects the percentage of silicon atoms having phenyl pendant groups, the group ratio is typically about 10–100: 0–50: 0–50, or A (~10 to 100%); B(~0 to 50%): and C (~0 to 50%), with A+B+C=100%. Curing rates depend upon the particular group ratio and composition. The embodiments of this invention preferably comprise the use of all-methyl or methyl-phenyl oligomers, and may be cured at temperatures as low as 135° C. to generate films exhibiting high transistor performance.

The silsesquioxane precursors may be dissolved in a suitable solvent (referenced above), with the concentration of oligomer in the solvents ranging from about 10 to 80% by weight. Large areas of semiconductor films may be deposited from the liquid phase, and the performance of these FET devices is comparable to that of devices using thermally-grown $SiO_2$. The materials are compatible with low-cost high-resolution patterning techniques, including micro-contact printing. Such micro-contact printing techniques are known in the field and described in U.S. patent application Ser. No. 09/305,722, "High-Resolution Method for Patterning a Substrate with Micro-printing," filed May 5, 1999, having a common inventor hereto, assigned to the present assignee, and incorporated herein by reference.

Suitable silsesquioxane precursors for use in the present invention are commercially available from Techniglass Co, of Perrysburg, Ohio, under various product names (e.g., GR150, GR 653LPP, GR653L, GR710, GR 720P, and GR T630). Catalysts may be used to accelerate the condensation of the oligomers. A suitable catalyst (e.g., for GR150, GR720P, and GR 710), is aminoethyl isopropyl triethyoxysilane, available from Union Carbide, commercially known as A1100. The silsesquioxane precursors can be provided as solutions and may be used as such in forming the liquid-deposited dielectric films. Other silsesquioxane precursors known to those skilled in the field and described in the art may be used, such as described in U.S. Pat. No. 5,384,376 and Chem. Rev. 95, 1409–1430 (1995), which are incorporated herein by reference.

To prepare the inventive FETs, substrates suitable for organic devices are provided. Various plastics known in the field may be used. The inventors have found that silsesquioxanes tend to adhere better to MYLAR® (polyethylene terephthalate) substrates coated with indium tin oxide (ITO) as compared with glass substrates coated with ITO. For example, when regioregular poly(3-hexylthiophene) (PHT) was deposited as a semiconducting material from a chloroform solution onto the dielectric silsesquioxane films, the silsesquioxane films became delaminated from the ITO/glass substrates, whereas no noticeable changes were observed with ITO/MYLAR® substrates.

Advantageously, before the dielectric film is deposited, the substrates are cleaned or treated with reactive ion etching (RIE), e.g., with oxygen plasma, to provide a smooth and clean substrate surface. Substrate cleansing also may be achieved by rinsing with acetone, methanol, and/or de-ionized water. Applicants have discovered that the substrate surface (e.g., smoothness, cleanness, and constituents) affects the quality of the dielectric film (e.g., pinhole density and smoothness). RIE of the substrate surface with oxygen plasma before deposition of the silsesquioxane precursors may enhance the adhesion of the dielectric films, particularly for silicon substrates. In addition to cleaning the substrate surface, RIE with oxygen generates a highly hydrophilic surface to improve wetting and adhesion of the liquid-deposited silsesquioxanes. With GR 653LPP that had been deposited on a plasma-etched silicon substrate, an essentially pinhole free dielectric film was achieved over an area covering about 4 $cm^2$, even when the dielectric film was relatively thin, e.g., having a thickness of about 760 Å or less. In comparison, various pinholes could be observed for similarly prepared dielectric films fabricated using liquid-deposited GR150, although increasing the thickness of the dielectric film resulted in a decreased number of pinholes. With GR150, the pinholes were not apparent at film thicknesses of greater than 1980 Å. Thus, substantially uniform and pinhole free films may be formed, without the need for subsequent surface modification, when the silsesquioxane precursors are deposited onto smooth, plasma-treated ITO-coated substrates.

Surface pre-treatments of the substrates, such as by spin-coating with either a solution of 10–100% by weight A1100 in isopropyl alcohol or hexamethyldisilazane (HMDS), may enhance the quality of the dielectric film deposited thereon. The resultant dielectric film typically will have fewer pinholes and better uniformity when pre-treatments are performed.

Once cleaned and/or etched, the substrates are positioned for spin coating or other liquid deposition of the silsesquioxane precursors. The silsesquioxane precursors may be mixed with n-butanol, isopropanol, methanol or other acceptable solvents known in the field, particularly where GR150F is used, and catalysts, as referenced above, may be mixed in the solutions. However, the invention contemplates use of the silsesquioxane precursors as provided, e.g., without pretreatment or modification of the substrate surfaces or mixing or modification of the silsesquioxane precursors as provided from the supplier.

Resins GR 653LPP and GR 653L are all-methyl silsesquioxane precursors, and GR 150F, GR 710 and GR 720P are methyl-phenyl silsesquioxane precursors. The all-methyl precursors cure at a faster rate than the methyl-phenyl silsesquioxanes. However, the inventors have found that the methyl-phenyl silsesquioxane films adhere better to substrates.

Curing of the liquid-deposited silsesquioxane precursors may be achieved by heating coated substrates to temperatures less than 200° C., and preferably less than about 150° C., and even more preferably to less than 135° C. After curing, the films exhibited high dielectric strength, low leakage current, and good hydrolytic and thermal stability.

Optionally, the cured dielectric film surfaces can be treated to modify or alter the surface energy or chemistry. The silsesquioxane precursor films according to the invention are cured at low temperatures (e.g., less than 200° C., more preferably at about 135° C.), to be more compatible with engineering plastics having low glass transition temperatures while achieving high dielectric strengths. At these temperatures, hydroxyl (—OH) groups are present on the surface of the dielectric film. Only when these films are cured at very high temperatures (i.e., above 400° C. in oxygen or air), will most of the hydroxyl groups have reacted and the pendant groups have become oxidized to yield a low dielectric constant material (i.e., with films cured above 400° C., the organic pendant groups are removed due to oxidation). With this invention, the organic pendant groups, such as methyl and phenyl groups, are still present in the dielectric matrix after curing.

An additional feature of this invention relates to the presence of the hydroxyl groups. The inventors have discovered that silane reagents may be applied to modify the surface of the cured silsesquioxane dielectric films. Suitable silane reagents are selected from the group $X\text{-}Si(OR^1)_m(R^2)_n$, where the values for m and n are from 0 to 3 and m+n=3; $R^1$ is an alkyl group having from 1 to 6 carbon atoms; $R^2$ is an alkyl group having from 1 to 16 carbon atoms or a halogen group; and X is selected from one of the following substituents: aryl group (substituted, e.g., with a halogen, or unsubstituted); $F_3C(F_2C)_9(H_2C)$—; $NH(Si)(CH_3)_3$; and a saturated or unsaturated alkyl or alkoxycarbonyl having from 8 to 20 carbon atoms. Preferably, when m is 0 and n is 3, $R^2$ is a chlorine or a methyl group and X is either $F_3C(F_2C)_9(H_2C)$— or $NH(Si)(CH_3)_3$; preferably when m is 3 and n is 0, $R^2$ is methyl and X is either $F_3C(F_2C)_9(H_2C)$— or an aryl group (substituted, e.g., with a halogen, or unsubstituted); and preferably when m is 1 and n is 2, $R^1$ and $R^2$ are both methyl and X is a saturated or unsaturated alkyl or alkoxycarbonyl having from 6 to 20 carbon atoms.

Treatment of the dielectric film surface with these silane reagents may enhance the properties of the cured dielectric films and also can impact the quality of the cured dielectric film surface that will in turn, impact the performance of the subsequently deposited semiconducting layer. Thus, one skilled in the field will appreciate that the silane reagent is selected depending on the material used for the o active semiconducting layer. For example, regioregular poly(3-hexylthiophene) (PHT) has been used as a material for fabricating the active semiconducting layers of organic devices. However, the PHT layer contracts during solvent evaporation on the cured, untreated silsesquioxane films. The inventors have found treatment with silane reagents improves the wetting and adhesion of PHT films on the underlying silsesquioxane dielectric film. Use of dichloro and trichlorosilane reagents is not preferred when PHT is used as a semiconducting layer as these highly-reactive reagents tend to cause delamination of the dielectric film from the substrate. Also, poor film forming properties were observed when PHT was deposited on cured dielectric films that had been treated with silane reagents having the formulae: $F_3C(F_2C)_g(H_2C)$—$Si(OCH_3)_3$, $C_{18}H_{37}Si(OCH_3)_3$, or $CH_2CH$—$C(O)$—$O(CH_2)_3Si(OCH_3)(CH_3)_2$.

The resultant (treated or untreated) dielectric films are compatible with microcontact printing techniques and may be used in fabricating top-contact and bottom-contact geometry devices. For bottom-contact geometry, gold or silver electrodes may be printed directly on the dielectric films followed by deposition of semiconductor materials. A thin film of titanium (e.g., 10 Å) may be applied between the electrodes and the dielectric surface to strengthen the adhesion. With this process, the semiconducting materials are not exposed to etchants used in depositing the electrodes or titanium, thus yielding mechanically robust devices. For top-contact geometries, a semiconducting layer is deposited on the cured dielectric films, and electrodes are deposited and patterned on the semiconducting layer. This process is advantageous in that there is better contact between the electrodes and the semiconducting layer. However, sufficient adhesion must be present between the semiconducting layer and the dielectric film such that delamination of the layers does not occur during subsequent processing steps, such as patterning the electrodes, which are known in the field.

Performance of the FETs using the inventive liquid-deposited dielectric depends upon the type of silsesquioxane precursors used for the deposition, the presence of catalysts, the solvent composition and surface treatment, the speed at which the substrate is spun during the silsesquioxane precursor deposition (when spin-casting is used), the curing temperature, the treatment applied to the cured dielectric films (e.g., the silane reagent selected), the semiconducting material deposited on the dielectric film, the temperature at which the semiconducting material is deposited, and the geometry of the resultant FET. One skilled in the field will appreciate that these parameters are optimized depending on the application.

The following examples will serve to further typify the nature of the invention but should not be construed as a limitation on the scope thereof, which is defined by the appended claims.

EXAMPLE 1

Preparation Example

Plastic substrates suitable for organic FETs were provided and cleaned with acetone, methanol, and de-ionized water. The substrate surfaces were treated with RIE using oxygen plasma for one minute at 50 W. The substrates were taped to glass slides using KAPTON® tape before spin coating, and then again cleaned by applying isoproponal while spinning the substrate at 3000 rpm. A glass resin solution (e.g., comprising GR150 dissolved in n-butanol at a concentration of 25 wt % n-butanol with 1 wt % A110) was filtered once through a syringe filter with a pore size of 0.45 µm, and then twice through filters having a pore size of 0.19 µm, and dispensed on the substrates following by spinning at 1000 to 3000 rpm for one minute. The entire substrate was covered with the filtered solution and then spun at 1000 to 3000 rpm for one minute. (Preferred results are achieved when the solution is deposited so as to cover the entire substrate surface.)

The resultant substrates were cured in an oven at 135° C. for about 12 hours. The substrate surfaces were modified by soaking the substrates for about 15 minutes in a solution of one of the silane reagents previously described (about 5 wt %) in a hexane/chloroform (3:1) mixture. The modified film was rinsed with hexane and dried in an oven at 60° C. for about five minutes. The dielectric layer may be patterned using micro-contact printing and further layers, electrodes, and devices deposited applying methods known in the field.

EXAMPLE 2

Capacitance Values

Capacitance values for films produced according to the invention and the steps set forth in Example 1 are recorded below in Table 1.

TABLE 1

| Silsesquioxane material | Concentration of silsesquioxanes | Spin Rate (rpm) | Substrate | Capacitance (nF/cm$^2$) |
|---|---|---|---|---|
| GR 150 (methyl phenyl) | 25 wt % in n-butanol | 3K | SiO$_2$ (1000 Å) | 2.14 |
|  | 25 wt % in n-butanol | 3K | ITO/Mylar ® | 4.97 |
|  | 25 wt % A1100 (1 wt %) | 1K | ITO/Mylar ® | 2.74 |
| GR T630 (methyl phenyl and dimethyl) | 60 wt % in methanol | 3K | ITO/glass | 0.43 |

TABLE 1-continued

| Silsesquioxane material | Concentration of silsesquioxanes | Spin Rate (rpm) | Substrate | Capacitance (nF/cm$^2$) |
|---|---|---|---|---|
| GR 710 (methyl phenyl) | Unknown, use as rec'd, in n-butanol | 3K | ITO/Mylar ® | 19.11 |
| | Unknown, use as rec'd, in n-butanol | 1K | ITO/Mylar ® | 11.72 |
| GR 720 (methyl phenyl) | 13 wt % in propyl propasol | 3K | ITO/Mylar ® | 7.03 |
| | 13 wt % in propyl propasol | 1K | ITO/Mylar ® | 4.08 |
| GR 653 LPP | 31 wt % in n-butanol | 3K | ITO/glass | 0.87 |
| | 31 wt % in n-butanol | 4K | ITO/Mylar ® | 2.42 |
| | 31 wt %, A1100 (1 wt %) in n-butanol | 3K | ITO/Mylar ® | 1.59 |
| GR 653L | 30 wt % | 3K | ITO/glass | 0.75 |

As can be seen, the capacitance values differed depending upon the type of silsesquioxane precursors, the film thickness, the degree of cure, and the substrate type and surface treatment. In general, high speed deposition (about 3K rpm and above) is preferred as more consistent films were obtained as the spin speed was increased.

EXAMPLE 3

FET Performance as a Function of Semiconducting Material

The inventors evaluated the field-effect transistor performance of the inventive devices using six different organic semiconducting materials. The performance of these devices compared to the performance of devices having a polyimide or $SiO_2$ as the active dielectric layer. Top-contact geometry devices were prepared having dielectric films prepared from liquid-deposited silsesquioxane precursors as described in Example 1, that had been deposited on one of six organic semiconducting materials. In most cases, the substrate used was an ITO-coated MYLAR® plastic substrate, although in some instances a $SiO_2$/Si substrate was used, as noted below in Table 2. The material for fabricating the active semiconducting layer in each of these devices was selected from one of the following materials: n-channel vacuum evaporated hexadecafluoro copper phthalocyanine (FCuPc); p-channel vacuum evaporated copper phthalocyanine (CuPc), α-sexithiophene (α-6T), dihexyl-α-pentathiophene (DH-α-5T), and pentacene, and p-channel solution cast poly(3-hexylthiophene) (PHT). The semiconducting layers were deposited at room temperature, except in the case of FCuPc, which was deposited at 125° C. where noted in Table 2 below. The field-effect mobilities (FEM) and on/off ratios were recorded as follows:

TABLE 2

| MATERIAL OF ACTIVE SEMICONDUCTING LAYER: | FCuPc FEM-cm$^2$/Vs (On/off ratio) | CuPc FEM-cm$^2$/Vs (On/off ratio) | PHT FEM-cm$^2$/Vs (On/off ratio) | α-6T FEM-cm$^2$/Vs (On/off ratio) | DH-α-5T FEM-cm$^2$/Vs (On/off ratio) | Pentacene FEM-cm$^2$/Vs (On/off ratio) |
|---|---|---|---|---|---|---|
| ACTIVE DIELECTRIC FILM | | | | | | |
| GR 653LPP | 0.005 (200) (125° C.) | | Poor wetting | 0.0023 (10) | 0.014 (530) | |
| GR 653LPP w/1% A1100 | | | | | 0.019 (300) | |
| GR 653LPP w/plasma surface treatment | 0.0029(20) (125° C.) | | | On/off < 2 | | |
| GR 653LPP plasma/HMDS surface treatments | 0.003(50) (125° C.) (SiO$_2$/Si substrate) | | On/off < 2 | | | |
| GR 653LPP plasma surface treatment, then coat with JSR polyimide | 0.0025 (20–30) (125° C.) | | | | | |
| GR 150 | 0.001–0.003 (250) | 0.0026 (250) | 0.02 (spin-coat then cast or cast twice) | 0.006 (550–600) (SiO$_2$/Si) | 0.045 (600–1000) | 0.05–0.1 (10$^3$–10$^5$) |
| GR 150 | 0.003–0.008 (300) (125° C.) | | | | | |
| GR 150 w/1 wt % A1100 | | | | | 0.045 (2000–4000) | 0.05–0.1 (10$^3$–10$^5$) |
| GR 150 plasma surface treatment | 0.0083 (100) (SiO$_2$/Si) (125° C.) | | 0.006 (2–4) (SiO$_2$/Si) | 0.005 (4) SiO$_2$/Si) | | |
| PEDOT, glass resin 150 | 0.011 (25) (plastic) (125° C.) | | 0.015 (10) | | | |
| GR 653L | 0.0012 (70) (125° C.) | | | | | |

TABLE 2-continued

| MATERIAL OF ACTIVE SEMICONDUCTING LAYER: | FCuPc FEM- $cm^2/Vs$ (On/off ratio) | CuPc FEM- $cm^2/Vs$ (On/off ratio) | PHT FEM- $cm^2/Vs$ (On/off ratio) | α-6T FEM- $cm^2/Vs$ (On/off ratio) | DH-α-5T FEM- $cm^2/Vs$ (On/off ratio) | Pentacene FEM- $cm^2/Vs$ (On/off ratio) |
|---|---|---|---|---|---|---|
| GR T630 | 0.00019 (6) (125° C.) | | | | 0.0004 (10) | |
| GR T630 plasma surface treatment | 0.00048 (20) (125° C.) | | | | On/off < 2 | |
| GR 170 | 0.001– 0.003 (200–500) | | | | 0.04 (4000) | |
| GR 720 | 0.001– 0.003 (200–500) | | | | 0.046 (5000) | |
| JSR Polyimide (prior art) | 0.068 (20) | | 0.09–0.1 (5) | 0.1 (60– 400) | | |
| AMOCO Polyimide (prior art) | 0.018 (13) 0.02 (50, with HMDS) | | On/off < 2 | | | |

As reported in Table 2, JSR polyimide refers to Japanese Synthetic Rubber Co. AL 3046; AMOCO polyimide refers to Ultradel 7000P from Amoco Co.; and PEDOT refers to poly(3,4-ethylene-dioxythiophene), also known as Baytron P from Bayer Co.

For n-channel devices using FCuPc as the semiconducting layer that had been deposited at temperatures of about 125° C., mobilities were measured similar to those using $SiO_2$. As shown in Table 2, these field-effect mobilities were in the range of 0.00019 to 0.008 $cm^2$/Ns for ITO-coated MYLAR® substrates and 0.011 $cm^2$/Ns for PEDOT® coated plastic. Oxygen plasma treatment of the liquid-deposited dielectric film did not affect the on/off ratio of the devices having FCuPc as the active semiconducting layer. The off currents for these devices were generally low in the range of 1–5 nA; however, the on/off ratios for these devices were not high in each case (e.g., were generally less than 50) because the devices had relatively low on-currents, partly related to the low capacitance of the silsesquioxane dielectric films. On/off ratios generally in the range of 20–50 were obtained with the FCuPc devices. By comparison, the polyimide devices with FCuPc as the active semiconducting layer had higher field-effect mobilities of about 0.02 to 0.07 and on/off ratios in the range of 13–50. Use of a double layer dielectric, e.g., with a layer of JSR® polyimide deposited onto a layer of GR 653 LPP, did not increase the field-effect mobility. The double-layer structure has a lower breakdown voltage (~20V) as compared to a single layer of GR 653 LPP.

When CuPc was used as the semiconducting layer in devices using liquid-deposited silsesquioxane as the active dielectric, the field-effect mobility obtained at room temperature was in the range of $2-3\times10^{-3}$ $cm^2$/Vs. This value is reasonably high, especially considering the low substrate temperature used during deposition which is advantageous. Room temperature deposition is particularly useful for plastic substrates, since plastic substrates conduct heat poorly which could result in non-uniform deposition of the semiconducting layer.

When α-6T was used as the semiconducting layer, the field-effect mobility obtained at room temperature was in the range of $2-6\times10^{-3}$ $cm^2$/Vs for several types of liquid-deposited silsesquioxane dielectric films. These results are comparable to those obtained using the control dielectric of $SiO_2$ (~$5\times10^{-3}$ $cm^2$/Vs).

Generally, superior results were achieved with semiconducting layers of DH-α-5T or pentacene. When DH-α-5T was used as a semiconducting layer on various liquid-deposited silsesquioxane dielectrics, field-effect mobilities were in the range of 0.014 to 0.045 $cm^2$/Vs, and on/off ratios were high (in the range of 300–5000, and depending on the dielectric were in the range 2000–5000). Pentacene as a p-channel semiconductor was evaporated onto a GR-150 coated substrate held at room temperature. In this case, the mobility ranged between 0.05 and 0.1 $cm^2$/Vs, which is comparable to the control device using $SiO_2$ as a dielectric layer. Also, the off currents for the pentacene devices were low, e.g., generally in the range of several hundred pA, and high on/off ratios were achieved (in the range of $10^3-10^5$). In this instance adding catalyst (i.e., A1100) in the silsesquioxane precursor solution did not affect the transistor performance.

Devices using PHT as the semiconducting layer demonstrated the least desirable performance as compared with the other semiconductors tested. The on/off ratios were below two (e.g., when PHT was deposited on a GR 150 silsesquioxane dielectric). A chloroform solution of PHT showed poor surface wetting on all methyl silsesquioxane films (e.g., those using GR 653LPP and GR 653L). Although high field-effect mobilities (in the range 0.05 to 0.1 $cm^2$/Vs) were achieved with PHT semiconductors deposited on methylphenyl silsesquioxanes (GR 150, 710, 720P), the on/off ratios were poor, as noted. It was also observed that the PHT films had to be relatively thick (about 0.5 to 0.1 μm) to form uniform films. To enhance the wetting and film forming properties, it was found that the GR 150 dielectric layer should be surface treated with a silane reagent before depositing the PHT as a semiconductor.

EXAMPLE 4

Treatment of Dielectric Film with Silane Reagents

Liquid-deposited dielectric films were prepared on ITO-coated MYLAR® substrates as described above using GR 150 as silsesquioxane precursor and curing at 135° C. Eight different silane reagents were applied to treat the cured dielectric surfaces by soaking them in a solution of the silane reagent (about 5 wt %) in a hexane/chloroform (3:1)

mixture, followed by rinsing with hexane and drying in an oven at about 60° C. for about five minutes. The silane reagents comprised (1) $F_3C(F_2C)_8CH_2-Si(OCH_3)_3$; (2) $C_8H_{17}Si(OCH_3)(CH_3)_2$; (3) $C_6H_5Si(OCH_3)_3$; (4) $C_{18}H_{37}Si(OCH_3)_3$; (5) $CH_2CH-C(O)-O-(CH_2)_3Si(OCH_3)(CH_3)_2$; (6) $F_3C(F_2C)_9Si(Cl)_3$; (7) $Cl-CH_4SiCl_2CH_3$; and (8) $(CH_3)_3SiNHSi(CH_3)_3$ Regioregular PHT was deposited onto the treated, cured films followed by deposition of gold electrodes using shadow masks. The appearance of the PHT films and the performance of the FETs were recorded as follows:

TABLE 3

| Silane Reagent | Appearance of PHT Film | Mobility (cm²/Vs) | On/off ratio (−100 V vs. 0 V) |
|---|---|---|---|
| No Modification | Relatively uniform some areas dewetted | 0.13–0.21 | 10–20 |
| $F_3C(F_2C)_9CH_2-Si(OCH_3)_3$ | Very non uniform film | 0.05 | 1–2 |
| $C_8H_{17}Si(OCH_3)(CH_3)_2$ | Uniform film | 0.03–0.08 | 10–15 |
| $C_6H_5Si(OCH_3)_3$ | Uniform film | 0.14–0.16 | 10–20 |
| $C_{18}H_{37}Si(OCH_3)_3$ | Non uniform film | 0.08 | 10–15 |
| $CH_2CH-C(O)-O-(CH_2)_3Si(OCH_3)(CH_3)_2$ | Non uniform film | 0.13–0.18 | 10 |
| $F_3C(F_2C)_9-Si(Cl)_3$ | Delaminated during Surface modification | — | — |
| $Cl-CH_4SiCl_2CH_3$ | Delaminated during Surface modification | — | — |
| $(CH_3)_3SiNHSi(CH_3)_3$ | Uniform film | 0.06 | 20–30 |

As reported in Table 3, a "very non-uniform" film is one having an average thickness variation of greater than about 1 μm, and a "non-uniform" film is one having an average thickness variation of greater than about 0.05 μm.

EXAMPLE 5

Top-Contact vs. Bottom Contact Geometries

FET devices were prepared using ITO-coated MYLAR® substrates and liquid-deposited GR 150 as described in Example 1. Semiconducting layers were deposited on the dielectric film comprising one of the following: pentacene, DH-α-5T, CuPc, and FCuPc. The devices were fabricated having top or bottom contact geometries and gold or silver electrodes, deposited by shadow-masking or microcontact printing as noted in Table 4. Their field-effect mobilities and on/off ratios were recorded as follows:

TABLE 4

| Semiconductor | Electrode (geometry) | Mobility (cm²/Vs) | On/off ratio |
|---|---|---|---|
| Pentacene | Au (bottom) | 0.02–0.1 | 50–400 |
| | Au (bottom, shadow mask) | 0.02–0.1 | 10–50 |
| DH-α-5T | Au (bottom) | 0.01–0.05 | 50–100 |
| | Au (top) | Delamination of DH-α-5T during printing | |
| CuPc | Au (bottom, shadow mask) | 0.001–0.003 | 10–20 |
| | Au (top) | 0.001 | 10–20 |
| | Ag (top) | 0.001 | 1000–3000 |
| FCuPc | Ag (top) | 0.001 | 1000–3000 |

Figure 2:
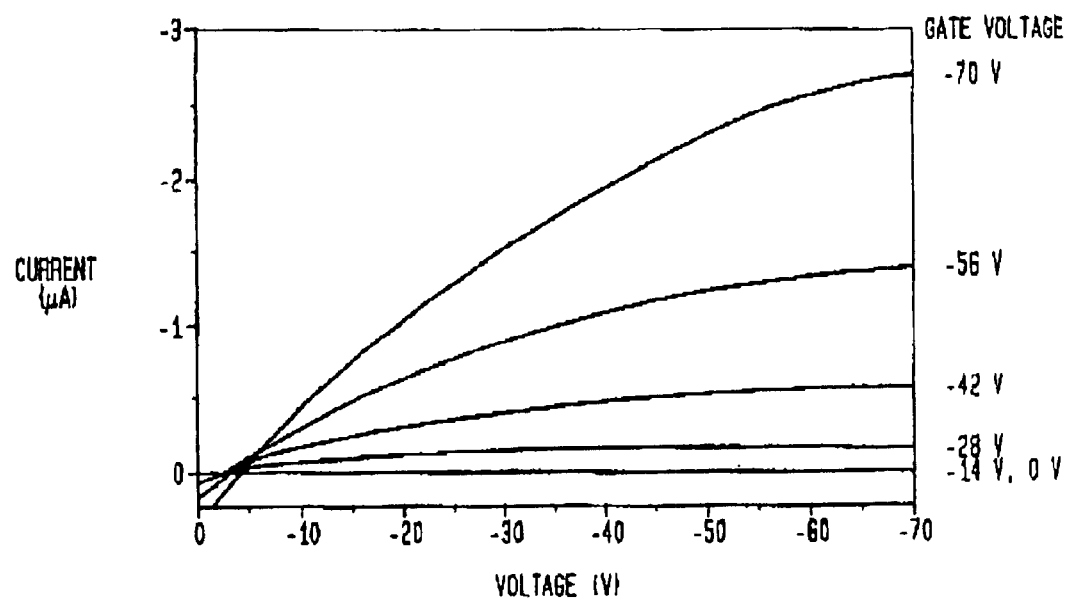
FIG. 2 is a graph plotting field-effect mobilities for inventive FET devices using copper phthalocyanine (CuPc) as the active semiconducting layer and top contact micro-contact printed silver (Ag) electrodes.
Figure 3:
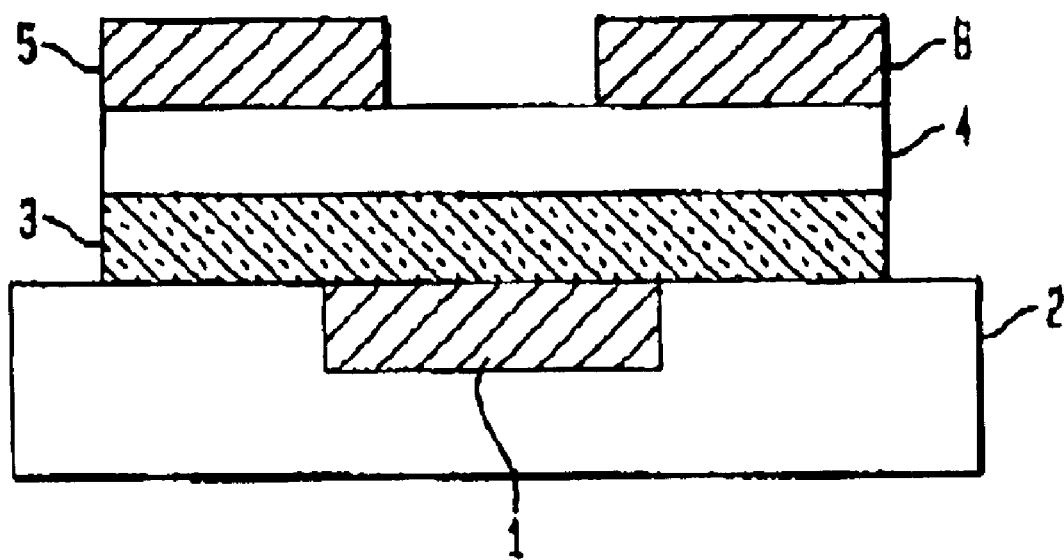
FIG. 3 illustrates an FET device of the invention.

FIG. 1 is a graph plotting current-voltage (I–V) values for the inventive FET devices using pentacene as the semiconducting layer and bottom-contact microcontact printed gold (Au) electrodes; and FIG. 2 is a graph plotting field-effect mobilities for the inventive FET devices using CuPc as the active semiconducting layer and top-contact silver (Ag) electrodes. As may be noted, devices having bottom-contact geometries showed lower on/off ratios than those having top-contact geometries regardless of whether the electrodes were prepared using micro-contact printing or shadow-masking. This suggests that the low on/off ratios associated with the bottom contact geometry are not attributable to the processing conditions involved with micro-printing. Also, the geometry-dependent differential in performance is related to the dielectric material used, as no such phenomenon was observed for devices having $SiO_2$ as the dielectric. Devices having pentacene as the semiconducting layer appear to produce the most advantageous on/off ratios for bottom-contact geometries, and generally low off-currents and high on/off ratios (~1000–3000) are obtained with top-contact printed devices.

It is understood that the embodiments described herein are merely exemplary and that a person skilled in the art may make variations and modifications without departing from the spirit and scope of the invention. All such variations and modifications are intended to be included within the scope of the appended claims.

We claim:

1. An organic field effect transistor (OFET), comprising: a gate dielectric layer on a substrate, said gate dielectric layer comprising at least one silsesquioxane precursor oligomer having phenyl pendant groups, and wherein said substrate is coated with indium tin oxide.

2. The OFET recited in claim 1, wherein said substrate comprises polyethylene terphthalate.

3. The OFET recited in claim 1, further comprising:
a gate electrode on said substrate, wherein said gate dielectric is on said gate electrode;
an organic semiconducting layer on said gate dielectric layer; and
a source electrode and a drain electrode in contact with said organic semiconducting layer.

4. The OFET recited in claim 3, wherein said substrate comprises polyethylene terphthalate.

5. The OFET recited in claim 1, further including another silsesquioxane precursor oligomer having methyl pendant groups.

6. The OFET recited in claim 1, further including another silsesquioxane precursor oligomer having dimethyl pendant groups.

7. The OFET recited in claim 1, wherein said silsesquioxane precursor oligomer is an alkyl(methyl)phenyl oligomer.

8. An organic field effect transistor (OFET), comprising:
a gate dielectric layer on a substrate, said gate dielectric layer comprising at least one silsesquioxane precursor oligomer having phenyl pendant groups and wherein said gate dielectric layer is a silane-reagent treated layer.

9. The OFET recited in claim 8, wherein said silane reagent is selected from the group $X-Si(OR^1)_m(R^2)_n$, where the values for m and n are from 0 to 3 and m+n=3; $R_1$ is an alkyl group having from 1 to 6 carbon atoms; $R^2$ is an alkyl group having from 1 to 16 carbon atoms or a halogen group; and X is a substituent selected from a substituted or unsubstituted aryl, $F_3C(F_2C)_9CH_2-$, the group $NH(Si)(CH_3)_3$; and a saturated or unsaturated alkyl or alkoxycarbonyl having from 6 to 20 carbon atoms.

10. The OFET recited in claim 9, wherein said silane reagent is selected from $F_3C(F_2C)_9CH_2$—$Si(OCH_3)_3$; $C_8H_{17}Si(OCH_3)(CH_3)_2$; $C_6H_5Si(OCH_3)_3$; $C_{18}H_{37}Si(OCH_3)_3$; $CH_2CH$—$C(O)$—$O$—$(CH_2)_3Si(OCH_3)(CH_3)_2$; $F_3C(F_2C)_9$—$Si(CL)_3$; $Cl$—$CH_4SiCl_2CH_3$; and $(CH_3)_3SiNHSi(CH_3)_3$.

11. The OFET of claim 8, wherein said substrate is coated with indium tin oxide.

12. The OFET recited in claim 11, wherein said substrate comprises polyethylene terphthalate.

13. The OFET recited in claim 8, further comprising:

a gate electrode on said substrate, wherein said gate dielectric is on said gate electrode;

an organic semiconducting layer on said gate dielectric layer; and a source electrode and a drain electrode in contact with said organic semiconducting layer.

* * * * *